United States Patent [19]
Haugsjaa et al.

[11] Patent Number: 6,023,339
[45] Date of Patent: *Feb. 8, 2000

[54] ONE-DIMENSIONAL ACTIVE ALIGNMENT OF OPTICAL OR OPTO-ELECTRONIC DEVICES ON A SUBSTRATE

[75] Inventors: Paul O. Haugsjaa, Acton, Mass.; Robert A. Boudreau, Hummelstown, Pa.; Michael J. Urban, Auburn, Mass.

[73] Assignee: GTE Laboratories Incorporated, Waltham, Mass.

[*] Notice: This patent is subject to a terminal disclaimer.

[21] Appl. No.: 09/273,898

[22] Filed: Mar. 22, 1999

Related U.S. Application Data

[63] Continuation of application No. 08/599,213, Feb. 9, 1996.
[51] Int. Cl.$^7$ .................................................. G01B 11/00
[52] U.S. Cl. ................................................................ 356/401
[58] Field of Search .................................. 356/399–401, 356/138, 153; 385/93, 89, 49, 14, 46, 51, 63, 83; 228/105

[56] References Cited

U.S. PATENT DOCUMENTS 5,042,709  8/1991  Cina et al. .
5,436,996  7/1995  Tabasky et al. .

OTHER PUBLICATIONS

Fletecher "Inexpensive Assembly Technique Promises to Radically Cut the Cost of 1.55 μm Optical Communication Lasers" Electrical Design Jun. 26, 1995 pp. 32–33.

*Primary Examiner*—K. P. Hantis
*Attorney, Agent, or Firm*—Leonard Charles Suchyta

[57] ABSTRACT

The present invention involves a combination of active and passive optical or opto-electronic device alignment techniques. Passive alignment is used for two axial lateral directions and all three axial rotational directions (yaw, pitch and roll). In such passive alignment, only the substrate is micromachined with passive alignment structures. One-dimensional active alignment is then used for the remaining axial lateral direction.

5 Claims, 4 Drawing Sheets

ONE-DIMENSIONAL ACTIVE ALIGNMENT OF OPTICAL OR OPTO-ELECTRONIC DEVICES ON A SUBSTRATE

CROSS-REFERENCE TO RELATED APPLICATIONS

The present application is a continuation of U.S. patent application Ser. No. 08/599,213 filed Feb. 9, 1996 and Continued Prosecution application Ser. No. 08/599,213 filed Jan. 28, 1998, the contents of which are incorporated herein by reference in their entirety.

FIELD OF THE INVENTION

The present invention relates to a method of precisely aligning optical or opto-electronic devices, such as semiconductor laser arrays, switch arrays, photodetectors, optical waveguides, optical fibers and optical amplifiers on a substrate to form an integrated package or assembly.

BACKGROUND OF THE INVENTION

When opto-electronic devices such as those mentioned above are fixed to a substrate, such as a silicon waferboard substrate, during fabrication of an overall assembly, the devices must be precisely aligned with respect to each other in order for the overall combined packaged assembly to operate properly. That is, if both a semiconductor laser device and an optical fiber are to be placed on the same substrate so that they interact with each other, the optical axis of the laser must be precisely aligned with that of the optical fiber, so that a laser beam emitted from the semiconductor laser will be precisely guided in the intended direction by the optical fiber. In addition, the spacing between each device must also be precisely set during fabrication.

Two methods of obtaining such alignment of devices are well known in the art. The first is called active alignment because, in the above example of a semiconductor laser being aligned to an optical fiber, the laser is turned on during the alignment process. According to the active alignment method, the light beam emanating from the laser is passed through the fiber and a photodetector placed at the other end of the fiber monitors the amount of light passing through the fiber as the laser is iteratively moved with respect to the fiber, in three axial lateral dimensions (x, y, z) and in three axial rotational directions (rotation about each of axes x, y, z). Optionally, the fiber can be iteratively moved with respect to the laser. That is, the positional relationship between the laser and the fiber is continuously altered until the photodetector detects an optimal alignment of the beam, indicated by maximum detected intensity. Once the optimal alignment is achieved, both the laser and the fiber are fixed into place on the substrate by adding a bonding agent, such as solder, to junction points between each device and the substrate.

Since this iterative process is required in order to precisely align the optical or opto-electronic devices, the active alignment technique is quite time-consuming and thus results in high fabrication costs. Further, many complex multiple optical beam devices (such as a semiconductor laser array which outputs a plurality of laser beams side-by-side) are nearly impossible to practically package using this technique, since alignment of one beam can affect the others, thus requiring that each beam be monitored while the alignment of each beam is iteratively adjusted.

The second known alignment technique was developed by GTE® Laboratories as an improvement over the active alignment technique, and is described in U.S. Pat. No. 5,436,996 herein incorporated by reference. This second technique is called a passive alignment technique, because during alignment, taking the laser/optical fiber example, the laser is turned off. The substrate upon which the laser and optical fiber will be affixed, and the laser itself, are formed with micromachined surfaces (e.g., pedestal stops, standoffs and alignment notches). For example, alignment notches would be formed in the laser device in order to aid in the lateral alignment of the active region of the laser device. In this way, the micromachined surface of the laser can be easily fit into its predetermined place on the substrate by an interlocking of the mating micromachined surfaces of the laser and substrate. The optical fiber sits in a V-groove already etched into the substrate.

The passive alignment technique greatly lowers the total time required for obtaining the optimal alignment of optical or opto-electronic devices, since the specific locations for each device on the substrate are predetermined and accounted for by micromachining during manufacture of each device and of the substrate. However, while it is possible for an assembly manufacturer (i.e, a manufacturer of the overall integrated package assembly of the substrate and the mounted devices) to have good control over the micromachining of the substrate, it is difficult for the assembly manufacturer to maintain such control over the micromachining of various devices. That is, each device is potentially made by a different device manufacturer and the assembly manufacturer would have to make sure that each device manufacturer micromachines its device in exactly the required manner.

Thus, there are disadvantages to both well known alignment methods and a satisfactory alignment method which does not suffer from such disadvantages was not known in the prior art. For this reason, the formation of integrated packages has become quite difficult. In the past, such difficulty could be tolerated, since one of such integrated packages would be shared amongst thousands of telephone fiber optic communications customers. However, the need for quickly and accurately aligning optical or opto-electronic devices on a substrate has become more and more important recently as telephone companies begin extending optical fiber networks directly to the home.

SUMMARY OF THE INVENTION

The present invention involves a combination of the active and passive optical or opto-electronic device alignment techniques. Passive alignment is used for two axial lateral directions and all three axial rotational directions (yaw, pitch and roll). In such passive alignment, only the substrate is micromachined with passive alignment structures. One-dimensional active alignment is then used for the remaining axial lateral direction.

This results in a simplification and streamlining of the full active technique of the past, while eliminating the requirement for micromachining the devices (which will be placed on the substrate) with alignment structures.

A further advantage is that it allows for active alignment of one of the most positionally sensitive axes (the lateral alignment) that is otherwise difficult to align passively, thereby improving both manufacturing yield and performance.

DETAILED DESCRIPTION OF THE PREFERRED EMBODIMENTS

Figure 1:
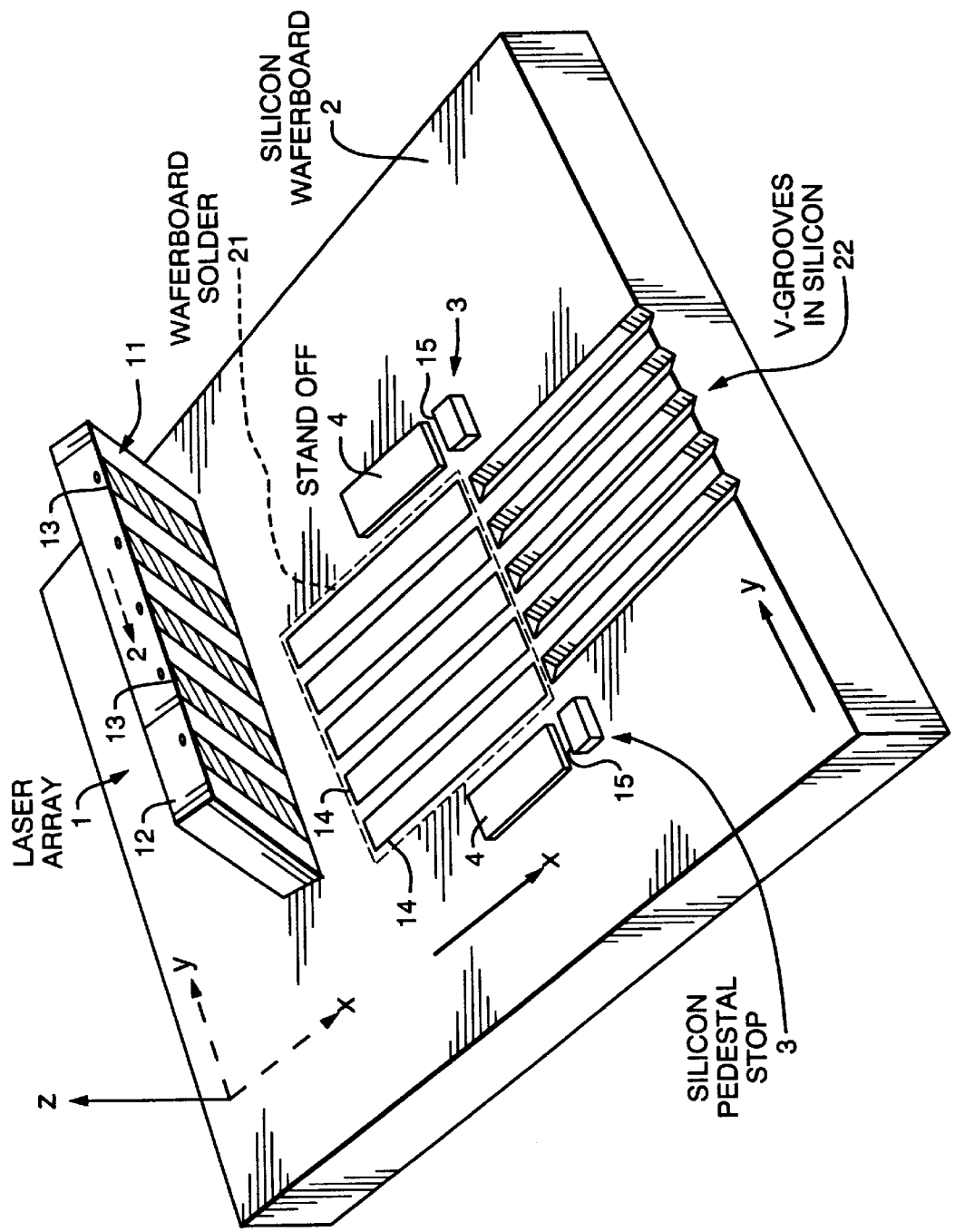
FIG. 1 shows an example of an integrated package of optical or opto-electronic devices formed according to the alignment technique in accordance with the present invention.

An embodiment of the present invention will now be described in conjunction with FIG. 1.

Laser array opto-electronic device 1, which emits a plurality of side-by-side light beams, is being aligned with respect to a respective plurality of optical fibers (each sitting in a V-groove 22) on silicon waferboard substrate 2. The underside 11 of laser array device 1 includes a plurality of conductive electrodes 13 and is being laid flat onto silicon waferboard substrate 2 over a corresponding plurality of conductive pads 14 in a waferboard solder area 21 of substrate 2, so that electrodes or striped areas on the device underside 11 and the pads on the substrate solder area 21 match up. Substrate 2 also has V-Grooves 22, etched therein, for holding optical fibers which channel the laser beams emitted from the laser array opto-electronic device 1. As is apparent from FIG. 1, it is important that the electrodes align with the pads, and It is critical that the laser array device 1 be precisely aligned onto substrate 2 so that the laser beams emitted from device 1 will correctly be guided by the optical fibers laid in V-Grooves 22.

Passive alignment techniques are used for aligning laser array device 1 in the x direction (the direction parallel to the longitudinal direction of the V-Grooves 22) and in the z direction (the direction perpendicular to the plane of silicon substrate 2). Silicon pedestal stops 3 are formed in the surface of substrate 2 for aligning device 1 in the x direction. Stand offs 4 are formed in the surface of substrate 2 for aligning device 1 in the z direction. These two passive alignment mechanisms will now be discussed more fully. These mechanisms are also fully described in the above-mentioned U.S. Pat. No. 5,436,996.

Micromachined pedestal stops 3 are fabricated, in the case of a silicon waferboard substrate, by etching most of the substrate surface anisotropically to reveal pedestals in several areas. These pedestals rise above the remainder of the substrate surface and provide abutment surfaces 15 on the stops against which a cleaved surface 12 of the laser array device 1 abuts during alignment.

In addition to providing lateral alignment in the x direction, stops 3 also provide angular (rotational) alignment about the x, y and z axes between the substrate and the cleaved surface 12 of the laser array device. Preferably, the cleaved surface 12 is clean and made along a semiconductor crystal axis of the laser array device to facilitate smooth interaction between the cleaved surface 12 and the abutment surfaces 15 of the stops 3. Similarly, although the abutment surfaces 15 can be virtually any configuration effecting the desired axis, the abutment surfaces 15 should be smooth and not sharp or jagged so as to avoid damage to the cleaved surface 12 of the laser array device.

Micromachined stand offs 4 are fabricated on the surface of substrate 2 for aligning device 1 in the z direction (height direction of the device above the surface of the substrate 2) perpendicular to the substrate surface. In the case of a silicon waferboard substrate, standoffs are made of a deposited polyamide film layer. However, other materials could also be used. The thickness of the layer (typically about 3 to 5 microns) can be adjusted to correspond to the active region position of the device. This active region position depends on the epitaxial crystal growth of the device.

Figure 2:
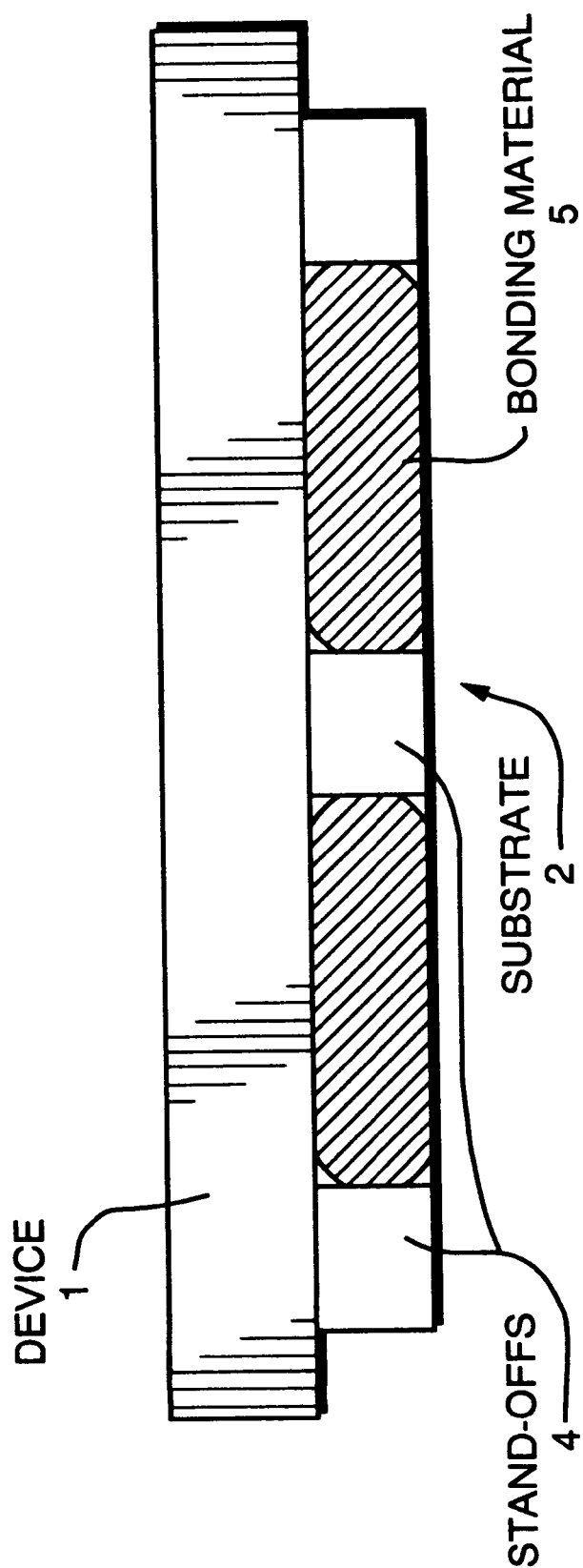
FIG. 2 shows a preferred embodiment of the fixing of an opto-electronic device to passive stand-offs formed on the substrate surface.

The height of the laser array device 1 is fixed at a predetermined distance (equal to the polyamide layer thickness) above the substrate 2's surface as shown in FIG. 2. The device 1 will be held against the stand-offs 4 while a bonding material 5, typically solder, flows beneath areas of the device not in contact with the stand-off. Alternatively, the standoffs 4 are not necessary if a precise soldering technique is used such that the solder itself supports the device 1 in the z-direction.

The above passive alignment techniques provide alignment for a device in the x and z lateral directions and the rotational directions about the x, y and z axes. Alignment in the y lateral direction is provided, according to a preferred embodiment of the present invention, by a one-dimensional active alignment technique.

The one-dimensional active alignment technique used in the present invention is much simpler than the well known three-dimensional active alignment technique discussed above. Basically, the laser array device 1 has already been positioned, using passive techniques, in two lateral dimensions (x and z). Therefore, all that remains is to perform a one-dimensional active alignment in the y dimension. This can be performed, for example, by keeping the laser array device 1 accurately positioned against stops 3 and standoffs 4 (thus maintaining two dimensional passive alignment with the optical fibers placed in V-grooves 22) and sliding the laser array device 1 in the y-dimension until the laser beams are so-aligned with the optical fibers that photodetectors placed at the other end of the fibers are detecting a maximum intensity of light transmitted through the fibers.

Another example of the invention will now be explained in conjunction with FIG. 4. Semiconductor laser device 41 is being aligned to an optical waveguide 46 fabricated on a silicon substrate 42 with an optical fiber 47 held in a V-groove aligned to the waveguide 46.

Figure 3:
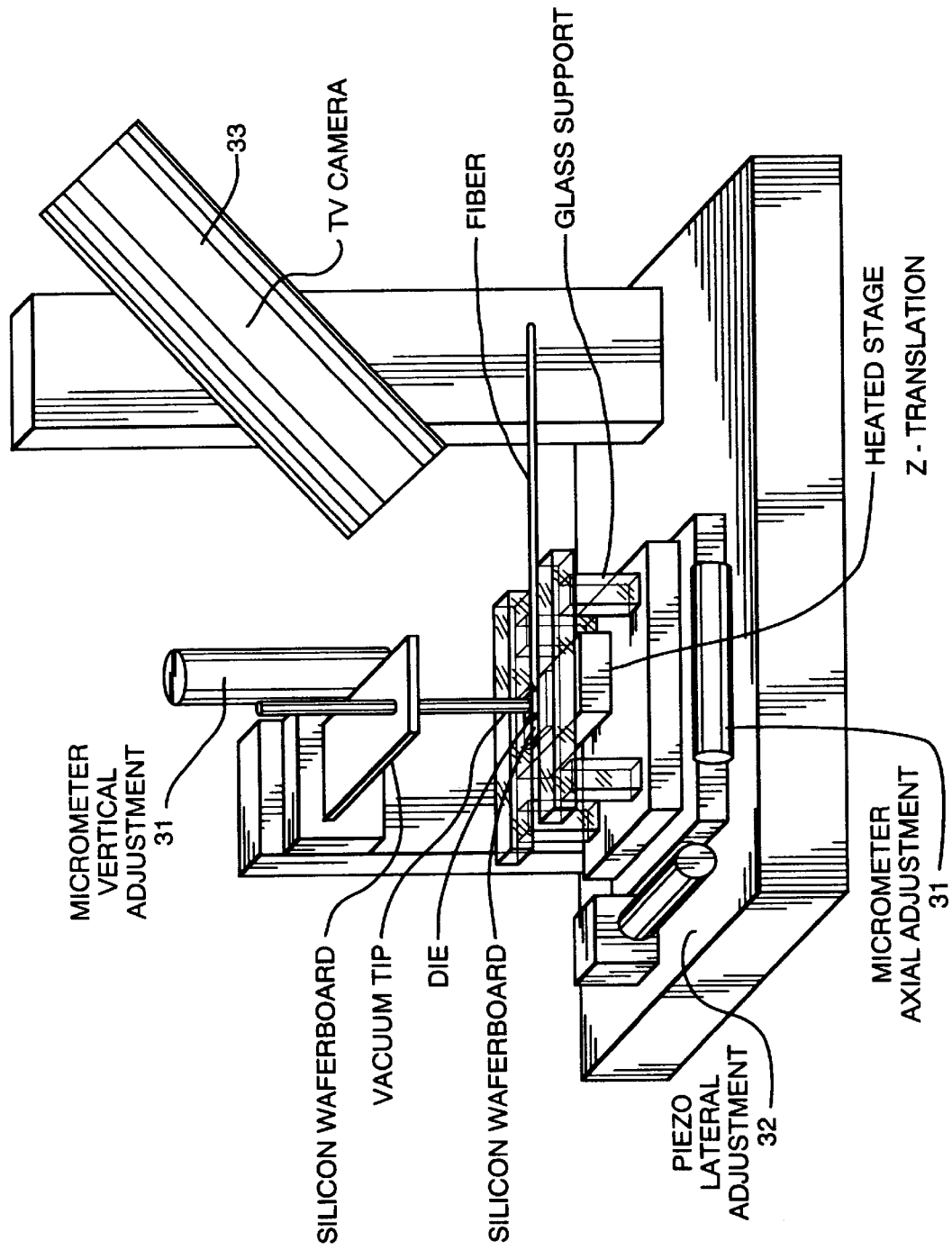
FIG. 3 shows an apparatus which could be used to adjust the optical or opto-electronic devices during the alignment technique of the present invention.

An example of an apparatus which can be used to adjust the position in three lateral dimensions of the optical or opto-electronic device as it is being aligned is shown in FIG. 3. Micrometer and piezo adjustment mechanisms, 31 and 32 respectively, are provided for making adjustments in the device's position in each of three directions. A TV camera 33 is used to detect when the device has been correctly abutted against the stops during passive alignment.

Figure 4:
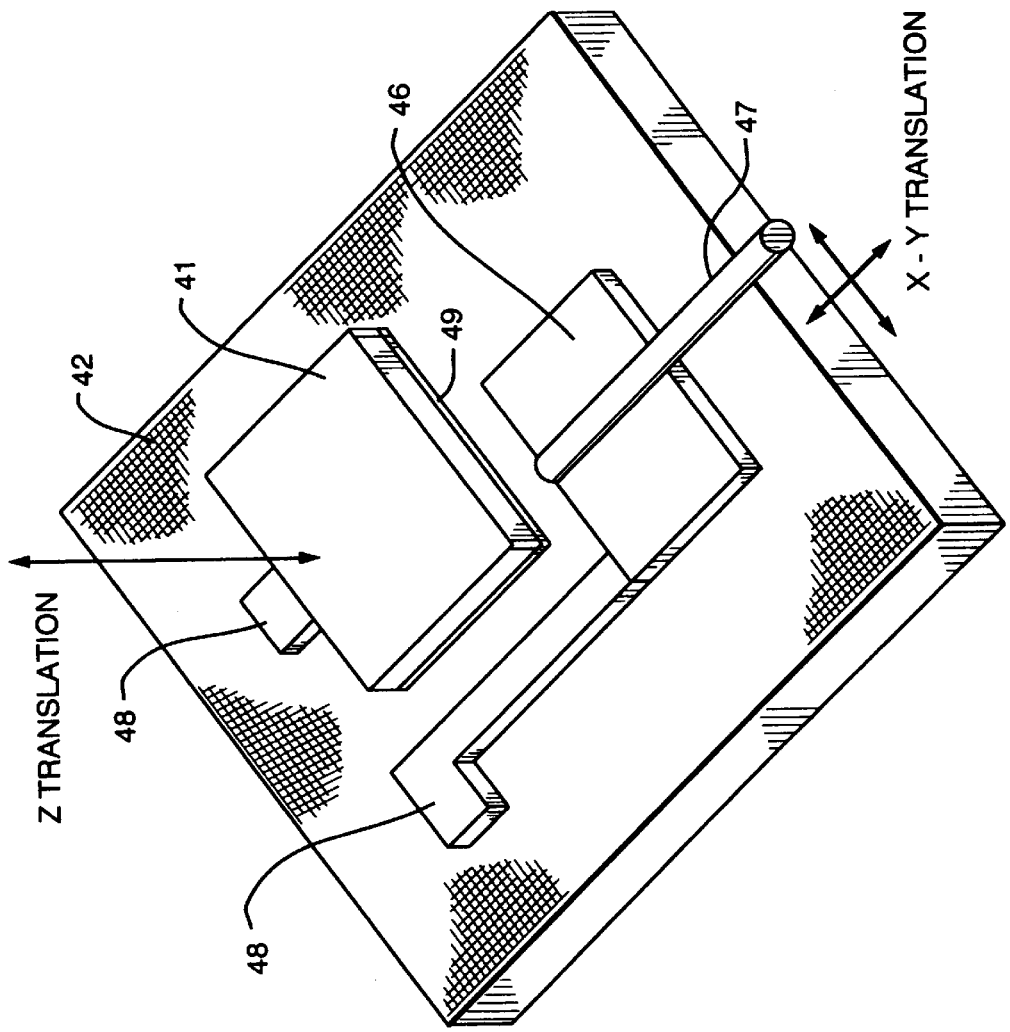
FIG. 4 shows another example of an overall package of devices, fabricated according to an embodiment of the present invention.

In FIG. 4, the stops used to align the laser 41 in the x direction are provided by the deposited silicon dioxide used in the fabrication of the waveguide structure. Standoffs 48, made of polyamide covered with a thin gold film, is provided for z direction alignment. In this embodiment, the standoffs 48 also provide the electrical contact, via the thin gold film, to the laser substrate for powering the laser 41 during one-dimensional active alignment in the y direction. The indium solder pad 49 has a thickness less than that of the standoffs 48 to allow the laser to be freely moved to the proper height (during z direction alignment).

Upon achieving the correct alignment position by movement of the semiconductor laser 41 against the stops and standoffs, it was possible to achieve good one-dimensional active alignment of the laser 41 by monitoring, using the microscope, light transmitted into the optical fiber in the V-groove 47. In an experiment on the above device, a coupling efficiency for a 1.3 micrometer wavelength laser to single-mode fiber was measured to be approximately 11% prior to soldering and 10% after soldering. Thus, in addition to demonstrating the operation of the technique, the stability of the method was also shown.

In summary, passive alignment techniques are used to align a device on a substrate in two of three lateral axial directions and in all three rotational axial directions. For the remaining lateral axial direction, an active alignment technique is used. The overall alignment process according to the present invention is much less time consuming than a purely active alignment technique because active alignment is only necessary in one direction. The overall alignment process according to the present invention is also advantageous over a purely passive alignment technique because there is no need to provide devices with micromachined surfaces (only the substrate need be micromachined).

The present invention is not to be limited by the above-described embodiments but only by the spirit and scope of the appended claims.

What is claimed is:

1. A method of aligning a laser chip device with respect to an optical fiber before securing said laser chip onto a substrate, said method comprising the steps of:

providing a substrate having three dimensional micromachined surfaces;

providing a laser chip device;

passively aligning said laser chip on said substrate along two lateral axial dimensions utilizing said three dimensional micromachined surfaces on said substrate against at least one cleaved planar surface of said laser chip device; and actively aligning said laser chip device with respect to said optical fiber in the remaining lateral axial dimension.

2. The method according to claim 1, wherein said two lateral axial dimensions are along X and Z axes.

3. The method according to claim 1, wherein the remaining lateral axial dimension is along a Y axis.

4. A method of aligning a laser chip device with respect to an optical fiber before securing said laser chip onto a substrate, said method comprising the steps of:

providing a substrate having three dimensional micromachined surfaces;

providing a laser chip device;

passively aligning said laser chip on said substrate along X and Z lateral axial dimensions utilizing said three dimensional micromachined surfaces on said substrate against at least one cleaved planar surface of said laser chip device; and actively aligning said laser chip device with respect to said optical fiber along a Y lateral axial dimension.

5. A method of aligning a laser chip device with respect to an optical fiber before securing said laser chip onto a substrate, said method comprising the steps of:

providing a substrate having three dimensional micromachined surfaces including at least one pedestal stop and at least one standoff;

providing a laser chip device;

passively aligning said laser chip on said substrate along X and Z lateral axial dimensions utilizing said at least one standoff and said at least one pedestal stop, respectively, against at least one cleaved planar surface of said laser chip device; and actively aligning said laser chip device with respect to said optical fiber along a Y lateral axial dimension.

* * * * *